(12) United States Patent
Kugel et al.

(10) Patent No.: US 11,881,853 B2
(45) Date of Patent: Jan. 23, 2024

(54) TRUE COMPLEMENT DYNAMIC CIRCUIT AND METHOD FOR COMBINING BINARY DATA

(71) Applicant: International Business Machines Corporation, Armonk, NY (US)

(72) Inventors: Michael Berthold Kugel, Boeblingen (DE); Rolf Sautter, Bondorf (DE); Amira Rozenfeld, Rochester, MN (US); Harry Barowski, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/807,149

(22) Filed: Jun. 16, 2022

(65) Prior Publication Data

US 2023/0060610 A1  Mar. 2, 2023

(30) Foreign Application Priority Data

Aug. 27, 2021 (EP) .................................... 21193467

(51) Int. Cl.
*H03K 19/20* (2006.01)
*H03K 19/00* (2006.01)

(52) U.S. Cl.
CPC ......... *H03K 19/0016* (2013.01); *H03K 19/20* (2013.01)

(58) Field of Classification Search
CPC ........................... H03K 19/0016; H03K 19/20
See application file for complete search history.

(56) References Cited

U.S. PATENT DOCUMENTS 4,233,524 A * 11/1980 Burdick ............. H03K 19/1736
326/38
5,391,938 A  2/1995 Hatsuda
(Continued)

FOREIGN PATENT DOCUMENTS

CN  110597483 B  9/2020
JP  0644134 A  2/1994
(Continued)

OTHER PUBLICATIONS

"PCT Notification of Transmittal of the International Search Report and the Written Opinion of the International Searching Authority, or the Declaration", Applicant's file reference P202000146PCT01, International application No. PCT/EP2022/073539, International filing date Aug. 24, 2022, dated Dec. 16, 2022, 15 pages.

(Continued)

*Primary Examiner* — Kurtis R Bahr
(74) *Attorney, Agent, or Firm* — Stephen R. Yoder

(57) ABSTRACT

A true complement dynamic circuit for combining, in particular comparing, binary data on dynamic first and second input signals to third and fourth input signals, comprising at least a 1-bit compare circuit, wherein the dynamic first and second input signals are complementary signals during an evaluation phase, wherein a logical behavior is determined by the third and fourth input signals. A method for operating a true complement dynamic circuit for combining, in particular comparing, binary data on dynamic first and second input signals to third and fourth input signals, comprising operating at least a 1-bit compare circuit, wherein the dynamic first and second input signals are complementary signals during an evaluation phase, determining a logical behavior by the third and fourth input signals.

24 Claims, 7 Drawing Sheets

(56) References Cited

U.S. PATENT DOCUMENTS

| | | |
|---|---|---|
| 7,271,703 B2 | 9/2007 | Lee |
| 7,818,656 B2 | 10/2010 | Sogomonyan |
| 10,056,122 B2 | 8/2018 | Manning |
| 10,770,132 B1 * | 9/2020 | Jung ................ G11C 7/065 |
| 2003/0117170 A1 | 6/2003 | Meneghini |
| 2005/0134317 A1 * | 6/2005 | Gliese ............ H03K 19/1737 |
| | | 326/98 |

FOREIGN PATENT DOCUMENTS

| | | |
|---|---|---|
| KR | 101540539 B1 | 7/2015 |
| TW | 603340 B | 10/2016 |

OTHER PUBLICATIONS

Kugel et al., "True Complement Dynamic Circuit and Method for Combining Binary Data", European Patent Application EP21193467.4, Filed on Aug. 27, 2021, 36 pages.

Panda et al., "Area-Efficient Parallel-Prefix Binary Comparator", 2019 IEEE International Symposium on Smart Electronic Systems (iSES) (Formerly iNiS), IEEE, 2019, DOI 10.1109/ISES47678.2019.00016, 5 pages.

\* cited by examiner

TRUE COMPLEMENT DYNAMIC CIRCUIT AND METHOD FOR COMBINING BINARY DATA

BACKGROUND

The present invention relates in general to data processing systems, in particular, to a true complement dynamic circuit for combining, in particular comparing, binary data on dynamic first and second input signals to third and fourth input signals as well as a method for operating a true complement dynamic circuit.

Modern data processing systems may perform Boolean operations on a set of signals using dynamic logic circuits. Dynamic logic circuits are clocked. During the precharge phase of the clock, the circuit is preconditioned, typically, by precharging an internal node (dynamic node) of the circuit by coupling to a power supply rail. During an evaluation phase of the clock, the Boolean function being implemented by the logic circuit is evaluated in response to the set of input signal values appearing on the inputs during the evaluation phase. Mostly, it suffices to assume that the input signals have settled to their "steady-state" values for the current clock cycle, recognizing that the input value may change from clock cycle to clock cycle. Such dynamic logic may have advantages in both speed and the area consumed on the chip over static logic. However, the switching of the output node with the toggling of the phase of the clock each cycle may consume power even when the logical value of the output is otherwise unchanged.

U.S. Pat. No. 7,271,703 B2 discloses a 2-bit binary comparator, including: a comparison unit for receiving a first bit and a second bit to thereby compare the first bit with the second bit; and an enable unit for outputting a comparison result of the comparison unit as an output of the 2-bit binary comparator according to an enable signal. There is further disclosed a binary comparing device, including: a first 2-bit binary comparator for logically combining a first and a second input signals by using a power voltage as an enable signal; and a second 2-bit binary comparator for logically combining a third and a fourth input signals by using the output of the first 2-bit binary comparator as an enable signal.

In CN110597483B a full binary data high-speed comparison method and a system for an FPGA comparator are disclosed, which are characterized by comprising the following contents: carrying out consistency processing on any two input binary data; judging the symbols of the two data after consistency processing; acquiring original codes of the two data after consistency processing with the same sign bit and corresponding inverse codes thereof; according to the obtained original code and the corresponding inverse code thereof, logically simplifying each bit of the two data after the consistency processing to generate two simplified data; comparing the two simplified data with different corresponding bit effective weights to obtain the representation of the magnitude relation of the two simplified data.

KR101540539B1 discloses a magnitude comparator using a logic gate. The disclosed comparator, which compares N-bit binary data a and b, comprises: N AND gates which receive a Nth bit of the a and the b; (N−1) XNOR gates which receive Nth bit, except the least digit in the a and the b; and an OR gate which receives an output bit of the N AND gates.

SUMMARY

According to an embodiment of the present invention, a true complement dynamic circuit is proposed for combining, in particular comparing, binary data on dynamic first and second input signals to third and fourth input signals, comprising at least a 1-bit compare circuit, wherein the dynamic first and second input signals are complementary signals during an evaluation phase. A logical behavior is determined by the third and fourth input signals.

The third and fourth input signals are dynamic or static signals and complementary signals for the comparison function.

Further, a method is proposed for operating a true complement dynamic circuit for combining, in particular comparing, binary data on dynamic first and second input signals to third and fourth input signals, comprising operating at least a 1-bit compare circuit, wherein the dynamic first and second input signals are complementary signals during an evaluation phase, determining a logical behavior by the third and fourth input signals.

The third and fourth input signals are dynamic or static signals and complementary signals for the comparison function.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments.

DETAILED DESCRIPTION

Figure 1:
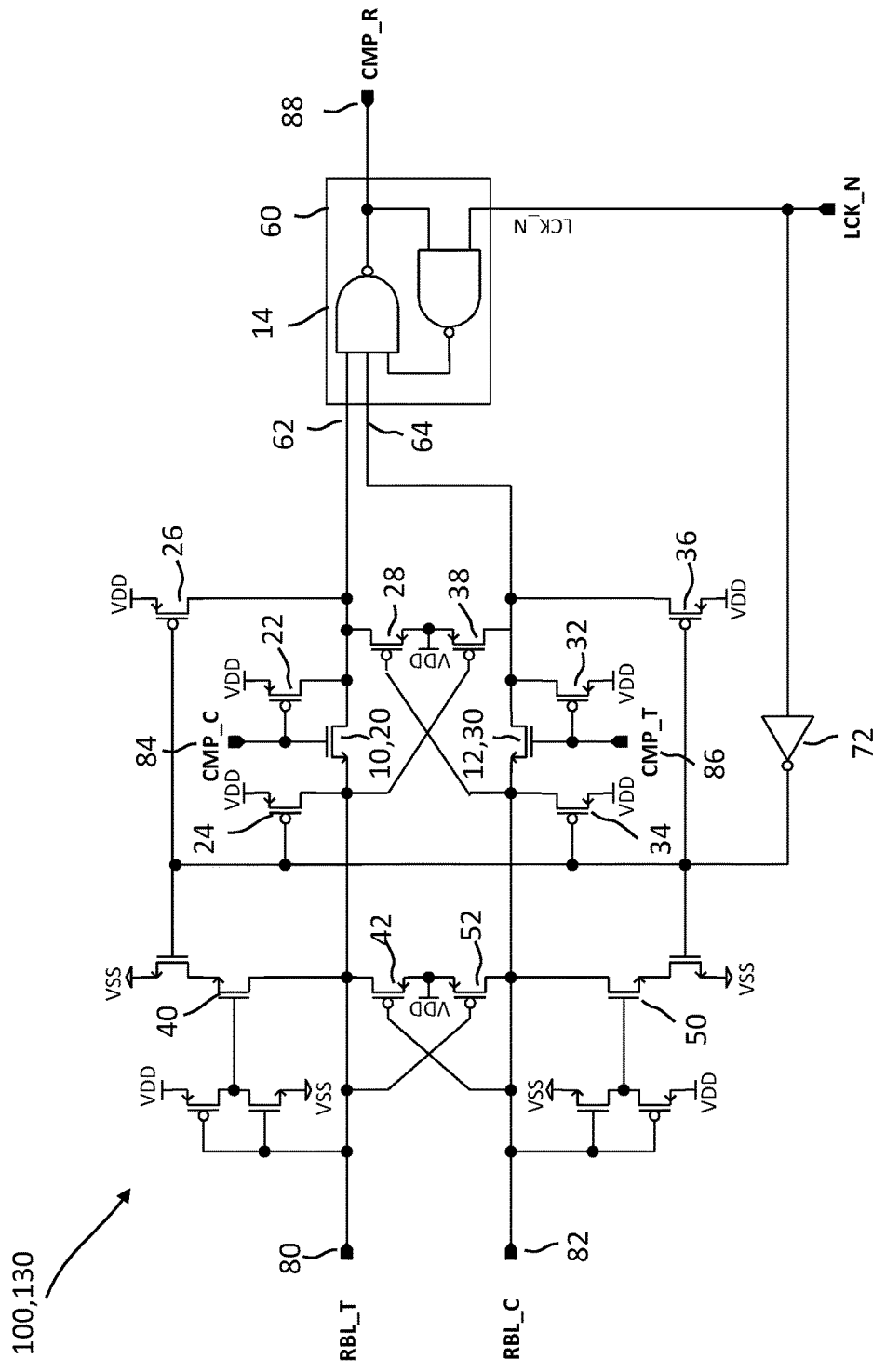
FIG. 1 depicts a true complement dynamic circuit for combining, in particular comparing, binary data on dynamic first and second input signals to third and fourth input signals representing an XNOR gate as a precharge to '1' logic circuit according to an embodiment of the present invention.

In the drawings, like elements are referred to with equal reference numerals. The drawings are merely schematic representations, not intended to portray specific parameters of the present invention. Moreover, the drawings are intended to depict only typical embodiments of the present invention and therefore should not be considered as limiting the scope of the present invention.

The illustrative embodiments described herein provide a true complement dynamic circuit for combining, in particular comparing, binary data on dynamic first and second input signals to third and fourth input signals, comprising at least a 1-bit compare circuit, wherein the dynamic first and second input signals are complementary signals during an evaluation phase. A logical behavior is determined by the third and fourth input signals.

The third and fourth input signals are dynamic or static signals and complementary signals for the comparison function.

The proposed true complement dynamic circuit offers an efficient bit compare circuitry for a directory memory cell macro, in particular for a directory SRAM (static random access memory) macro. Advantageously it may utilize current SRAM plan of record domino schemes.

This offers significant advantages for power consumption and timing performance compared to state of the art, where static/dynamic XNOR implementations are used.

The proposed circuit may thus exhibit significant advantages because it enables performing compare operations on complementary dynamic bit lines. It uses a bit line pass gate device topology. A two way cross coupled NAND logical component, e.g., may be used as part of the logic, implementing an XNOR logical behaviour for comparison. For testing a data read out on one of the read bit lines is possible if a true compare data signal is put to '1' in the case of a precharge to '1' logic, and is put to '0' in the case of a precharge to '0' logic. A read out on the other one of the read bit lines is possible if a complement compare data signal is put to '0' in the case of a precharge to '1' logic, and is put to '1' in the case of a precharge to '0' logic. In particular, setting one of the third or fourth signals to '1' and the other one to '0' at the same time enables a simple read data out of the read bit line with the 'enabled' pass gate transistor, wherein 'enabled' means a '1' for NFETs or '0' for PFETs.

In the proposed circuit, existing devices may thus be used more efficiently for functional purposes. Fewer logical stages are indicated for getting the same result. The circuit may exhibit faster operations. Its design is more area efficient compared to circuits in the state of the art.

Due to an embodiment of the present invention, additionally or alternatively the first and second input signals may be received from a true read bit line and a complement read bit line, respectively, wherein both signals are dynamic input signals. Thus both signals are complementary during the evaluation phase of the compare operation leading to stable comparison results.

Due to an embodiment of the present invention, additionally or alternatively the logical behavior may represent an XNOR gate in the case of a precharge to '1' logic circuit and an XOR gate in the case of a precharge to '0' logic circuit, respectively, if the third and fourth input signals are complementary signals during an evaluation phase. The third input signal may be received from a complement compare data line and the fourth input signal is received from a true compare data line. Thus the proposed design offers an advantageous flexibility in achieving comparison results for different technologies.

Due to an embodiment of the present invention, additionally or alternatively the logical behavior may represent an XOR gate in the case of a precharge to '1' logic circuit and an XNOR gate in the case of a precharge to '0' logic circuit, respectively, if the third and fourth input signals are complementary signals during an evaluation phase. The third input signal may be received from a true compare data line and the fourth input signal is received from a complement compare data line. Thus the proposed design offers an advantageous flexibility in achieving comparison results for different technologies.

Due to an embodiment of the present invention, additionally or alternatively the logical behavior may represent an 'A AND B' gate, wherein the third input signal is tied to a value of '0' and the fourth input signal is received from a true compare data line CMP_T. By this way an alternative logical function may be implemented with the same circuit in a different embodiment.

Due to an embodiment of the present invention, additionally or alternatively the logical behavior may represent an 'A OR NOT B' gate, wherein the third input signal is received from a complement compare data line and the fourth input signal is tied to a value of '1'. By this way an alternative logical function may be implemented with the same circuit in a different embodiment.

Due to an embodiment of the present invention, additionally or alternatively the 1-bit compare circuit may comprise at least a first part which is logically combining the first input signal and the third input signal with a logical 'A OR NOT B' operation creating a fifth signal; a second part which is logically combining the second input signal and the fourth input signal with a logical 'A OR NOT B' operation creating a sixth signal; and a third part for logically combining the fifth signal and the sixth signal to a seventh signal as an output, with a logical NAND operation in the case of a precharge to '1' logic circuit to a seventh signal as an output, or with a logical NOR operation in the case of a precharge to '0' logic circuit to a seventh signal as an output. The design of the proposed circuit thus is well structured and may be used in different embodiments with minor modifications.

Due to an embodiment of the present invention, additionally or alternatively the first part may comprise at least a first pass gate transistor, wherein the first input signal is received on a source of the first pass gate transistor; and wherein the third input signal is received on a gate of the first pass gate transistor.

The second part may comprise at least a second pass gate transistor, wherein the second input signal is received on a source of the second pass gate transistor; and wherein the fourth input signal is received on a gate of the second pass gate transistor. A simple structural design may thus be used for implementing the desired logical behaviour in a flexible way.

Due to an embodiment of the present invention, additionally or alternatively the third part may comprise at least a logical component, wherein the fifth signal is received on a first input of the logical component; and wherein the sixth signal is received on a second input of the logical component. The logical component may be implemented as a cross-coupled two-way NAND gate in the case of a precharge to '1' logic circuit; or as a cross-coupled two-way NOR gate in the case of a precharge to '0' logic circuit, respectively, representing a prefetch latch converting dynamic input signals back to a static output signal. In this part dynamic signals may be converted back to static CMOS logic behaviour, meaning that the logic value gets preserved during the precharge phase.

Due to an embodiment of the present invention, additionally or alternatively the seventh signal may be a comparison result of the first input signal and the second input signal versus the third input signal and the fourth input signal, respectively, as an output. Stable and reliable comparison results with efficient processing are advantages of the proposed circuit.

Due to an embodiment of the present invention, additionally or alternatively at least the first input signal and the second input signal may be dynamic signals, in particular restored to '1' signals or restored to '0' signals, respectively, during a precharge phase and complementary signals during an evaluation phase, wherein the third input signal and the fourth input signal are static signals or dynamic signals. At least during the evaluation phase the dynamic first and second input signals may be required to be complementary signals, whereas the third and fourth input signals may be static or dynamic in order to get the required logical behaviour of the circuit.

Due to an embodiment of the present invention, additionally or alternatively for compare operations the third input signal and the fourth input signal may be complementary signals. Complementary third and fourth signals for compare operations may also be used in order to get stable comparison results.

Advantageously cross-coupled transistors may be implemented for preserving precharge levels of the first input signal and the second input signal. This is an efficient way of achieving the preservation of the precharge levels of the first and second input signals.

Due to an embodiment of the present invention, additionally or alternatively the circuit may be controlled by a negative active clock signal in the case of a precharge to '1' logic circuit and by a positive active clock signal in the case of a precharge to '0' logic circuit, respectively, which is directly received as an input by the third part and which is received as an input by the first part and the second part via an inverter. Thus a stable and reliable behaviour of the proposed circuit for resulting in the desired logical functions can be achieved.

Due to an embodiment of the present invention, additionally or alternatively PFET devices in the case of a precharge to '1' logic circuit and NFET devices in the case of a precharge to '0' logic circuit, respectively, may be used for precharging the first input signal and the second input signal to '1' or to '0', respectively. Thus a favourable precharge behaviour of the proposed circuit may be achieved.

Due to an embodiment of the present invention, additionally or alternatively cross-coupled transistors, in particular cross-coupled PFET transistors in the case of a precharge to '1' logic circuit and cross-coupled NFET transistors in the case of a precharge to '0' logic circuit, respectively, may be implemented for preserving precharge levels for the signals that should remain at '1' or at '0', respectively, during the evaluation phase. This is an efficient way of achieving the preservation of the precharge levels of the first and second input signals.

Due to an embodiment of the present invention, additionally or alternatively the circuit may comprise N-keeper devices gated by the inverted negative active clock signal in the case of a precharge to '1' logic circuit and P-keeper devices gated by the inverted positive active clock signal in the case of a precharge to '0' logic circuit, respectively. Thus a stable and reliable behaviour of the proposed circuit for resulting in the desired logical functions can be achieved.

Due to an embodiment of the present invention, additionally or alternatively the third input signal may be connected to the gate of a keeper device as a keeper for the fifth signal and the fourth input signal may be connected to the gate of a keeper device as a keeper for the sixth signal. Thus a stable and reliable behaviour of the proposed circuit for resulting in the desired logical functions can be achieved.

Due to an embodiment of the present invention, additionally or alternatively PFET devices in the case of a precharge to '1' logic circuit and NFET devices in the case of a precharge to '0' logic circuit, respectively, may be used for precharging the fifth signal and the sixth signal, respectively. Thus a stable and reliable behaviour of the proposed circuit for resulting in the desired logical functions can be achieved.

Operating the true complement dynamic circuit offers efficient bit compare operations for a directory memory cell macro, in particular for a directory SRAM (static random access memory) macro. Advantageously it may utilize current SRAM plan of record domino schemes.

Operating the circuit may thus exhibit significant advantages because it enables performing compare operations on complementary dynamic bit lines. It uses bit line pass gate device topology. A two way cross coupled NAND logical component, e.g., may be used as part of the logic, implementing a XNOR logical behaviour for comparison. No performance degrading P-keeper devices are needed. For testing a simple data read out is possible if a true compare data signal is put to '1' in the case of a precharge to '1' logic, and is put to '0' in the case of a precharge to '0' logic. A read out on the other one of the read bit lines is possible if a complement compare data signal is put to '0' in the case of a precharge to '1' logic, and is put to '1' in the case of a precharge to '0' logic. In particular, setting one of the third or fourth signals to '1' and the other one to '0' at the same time enables a simple read data out of the read bit line with the 'enabled' pass gate transistor, wherein 'enabled' means a '1' for NFETs or '0' for PFETs.

By operating the circuit existing devices may thus be used more efficiently for functional purposes. Fewer logical stages are indicated for getting the same result. Operating the circuit may exhibit faster operations.

Due to an embodiment of the present invention, additionally or alternatively the first and second input signals may be received from a true read bit line and a complement read bit line, respectively, wherein both signals are dynamic input signals. Thus both signals may be complementary during the evaluation phase of the compare operation leading to stable comparison results.

Due to an embodiment of the present invention, additionally or alternatively the logical behavior may represent an XNOR gate in the case of a precharge to '1' logic circuit and an XOR gate in the case of a precharge to '0' logic circuit, respectively, if the third and fourth input signals are complementary signals during an evaluation phase, by receiving the third input signal from a complement compare data line and receiving the fourth input signal from a true compare data line. Thus an advantageous flexibility is offered in achieving comparison results for different technologies.

Due to an embodiment of the present invention, additionally or alternatively the logical behavior may represent an XOR gate in the case of a precharge to '1' logic circuit and an XNOR gate in the case of a precharge to '0' logic circuit, respectively, if the third and fourth input signals are complementary signals during an evaluation phase, by receiving the third input signal from a true compare data line and receiving the fourth input signal from a complement compare data line. Thus an advantageous flexibility is offered in achieving comparison results for different technologies.

Due to an embodiment of the present invention, additionally or alternatively the logical behavior may represent an 'A AND B' gate, by tying the third input signal to a value of '0' and receiving the fourth input signal from a true compare data line. By this way an alternative logical function may be implemented with the same circuit in a different embodiment.

Due to an embodiment of the present invention, additionally or alternatively the logical behavior may represent an 'A OR NOT B' gate, by receiving the third input signal from a complement compare data line and tying the fourth input signal to a value of '1'. By this way an alternative logical function may be implemented with the same circuit in a different embodiment.

Due to an embodiment of the present invention, additionally or alternatively the method may at least comprise logically combining the first input signal and the third input signal with a logical 'A OR NOT B' operation creating a fifth signal; logically combining the second input signal and the fourth input signal with a logical 'A OR NOT B' operation creating a sixth signal; and logically combining the fifth signal and the sixth signal to a seventh signal as an output, with a logical NAND operation in the case of a precharge to '1' logic circuit to a seventh signal as an output, or with a logical NOR operation in the case of a precharge to '0' logic circuit to a seventh signal as an output. The signal flow of the proposed method for operating the true complement dynamic circuit for combining, in particular comparing, binary data thus is well structured and may be used in different embodiments with minor modifications.

The illustrative embodiments may further be used for a method for operating a true complement dynamic circuit for combining, in particular comparing, binary data on dynamic first and second input signals to third and fourth input signals, comprising operating at least a 1-bit compare circuit, wherein the dynamic first and second input signals are complementary signals during an evaluation phase, determining a logical behavior by the third and fourth input signals.

FIG. 1 depicts a true complement dynamic circuit 100 for combining, in particular comparing, binary data on dynamic first and second input signals 80, 82 to third and fourth input signals 84, 86 representing an XNOR gate as a precharge to '1' logic circuit according to an embodiment of the present invention.

The true complement dynamic circuit 100 is configured as a 1-bit compare circuit 130, wherein the dynamic first and second input signals 80, 82 are complementary signals during an evaluation phase. The logical behavior is determined by the third and fourth input signals 84, 86, wherein the third and fourth input signals 84, 86 are dynamic or static signals.

The first and second input signals 80, 82 are received from a true read bit line RBL_T and a complement read bit line RBL_C, respectively, wherein both signals 80, 82 are dynamic input signals. The true read bit line RBL_T and a complement read bit line RBL_C, e.g., may be received from a memory cell as an SRAM cell.

The logical behavior represents an XNOR gate, if the third and fourth input signals 84, 86 are complementary signals during an evaluation phase. The third input signal 84 is received from a complement compare data line CMP_C and the fourth input signal 86 is received from a true compare data line CMP_T. Both signals 84, 86, e.g., typically come from logic functions, in particular may be received from a memory cell as an SRAM cell.

The 1-bit compare circuit 130 comprises a first part 10 which is logically combining the first input signal 80 and the third input signal 84 with a logical 'A OR NOT B' operation creating a fifth signal 62. Further it comprises a second part 12 which is logically combining the second input signal 82 and the fourth 86 input signal with a logical 'A OR NOT B' operation creating a sixth signal 64. Further it comprises a third part 14 for logically combining the fifth signal 62 and the sixth signal 64 to a seventh signal 88 as an output CMP_R; CMP_R_C, with a logical NAND operation.

The first part 10 comprises a first pass gate transistor 20, wherein the first input signal 80 is received on a source of the first pass gate transistor 20; and wherein the third input signal 84 is received on a gate of the first pass gate transistor 20.

The second part 12 comprises a second pass gate transistor 30, wherein the second input signal 82 is received on a source of the second pass gate transistor 30; and wherein the fourth input signal 86 is received on a gate of the second pass gate transistor 30.

The third part 14 comprises a logical component 60, wherein the fifth signal 62 is received on a first input of the logical component 60; and wherein the sixth signal 64 is received on a second input of the logical component 60. The logical component 60 is implemented as a cross-coupled two-way NAND gate and represents a prefetch latch converting dynamic input signals 80, 82 back to a static output signal 88.

The seventh signal 88 is a comparison result of the first input signal 80 and the second input signal 82 versus the third input signal 84 and the fourth input signal 86, respectively, as an output CMP_R.

The first input signal 80 and the second input signal 82 are dynamic signals, in particular restored to '1' signals during a precharge phase and complementary signals during an evaluation phase. The third input signal 84 and the fourth input signal 86 are static signals or dynamic signals. For compare operations the third input signal 84 and the fourth input signal 86 are complementary signals The true complement dynamic circuit 100 is controlled by a negative active clock signal LCK_N, which is directly received as an input by the third part 14 and which is received as an input by the first part 10 and the second part 12 via an inverter 72.

PFET devices 24, 34 are used for precharging the first input signal 80 and the second input signal 82 to '1'.

Cross-coupled transistors 42, 52 are implemented for preserving precharge levels of the first input signal 80 or the second input signal 82, in particular only for the one of both input signals 80, 82 that is not pulled down, in the case of a precharge to '1' logic or not pulled up, in the case of a precharge to '0' logic, respectively, by an SRAM cell or an evaluation device (like an NFET for a precharge to '1' logic and a PFET for a precharge to '0' logic).

The true complement dynamic circuit 100 comprises N-keeper devices 40, 50 gated by the inverted negative active clock signal LCK_N and controlled by the inverted input signals 80, 82.

The third input signal 84 is connected to the gate of a keeper device 22 as a keeper for the fifth signal 62 and the fourth input signal 86 is connected to the gate of a keeper device 32 as a keeper for the sixth signal 64.

PFET devices 26, 36 are used for precharging the fifth signal 62 and the sixth signal 64.

VDD represents the power supply voltage, VSS represents the respective ground level voltage.

Figure 2:
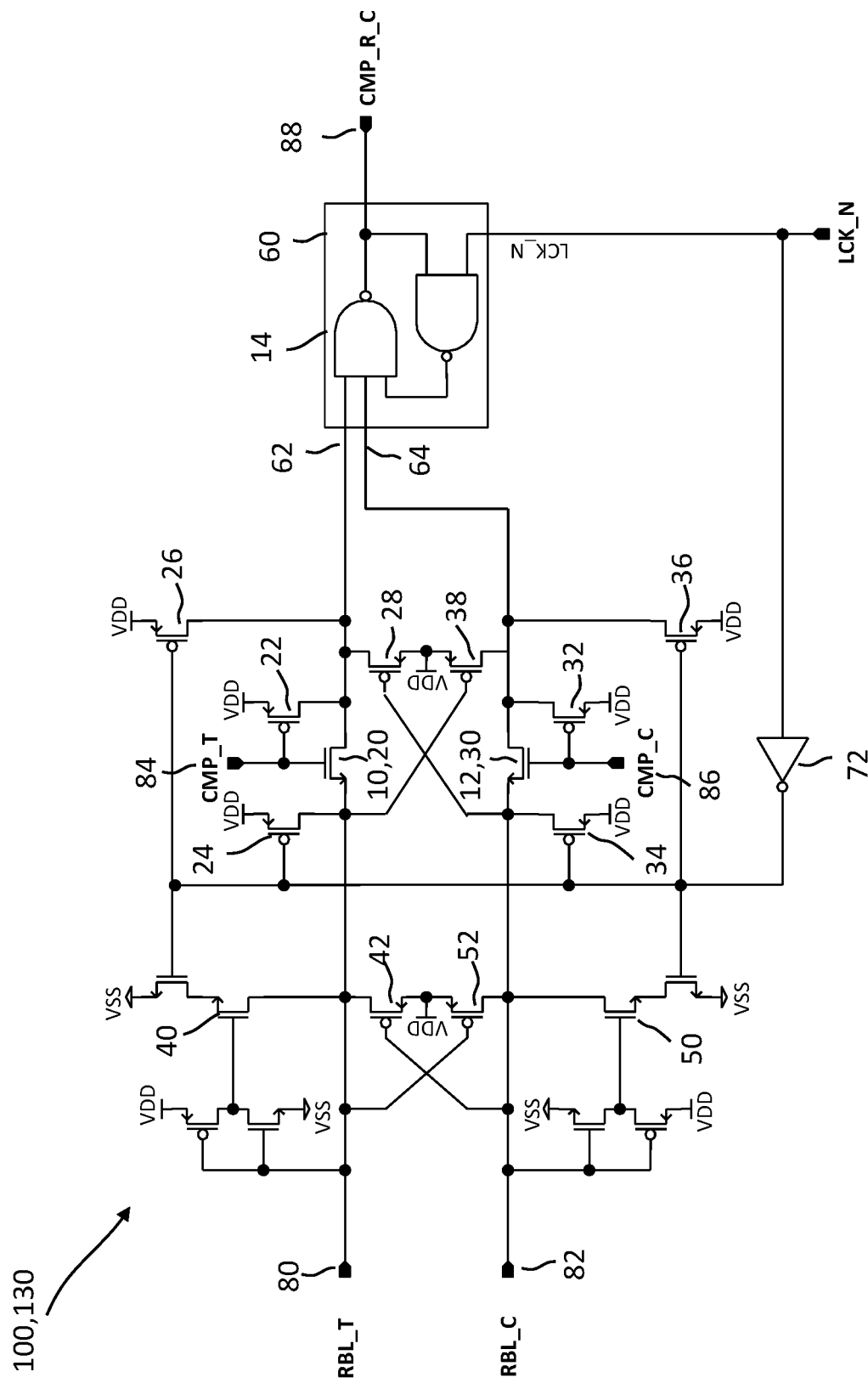
FIG. 2 depicts a true complement dynamic circuit for combining, in particular comparing, binary data representing an XOR gate as a precharge to '1' logic circuit according to a further embodiment of the present invention.

If the third and fourth signals 84, 86 of the embodiment depicted in FIG. 1 are swapped in a way that the third signal 84 is a true compare data line signal CMP_T and the fourth signal 86 is a complement compare data line signal CMP_C, the circuit 100 acts as a cross coupled XOR device. This embodiment is shown in FIG. 2. The seventh signal 88 results in an output CMP_R_C.

Figure 3:
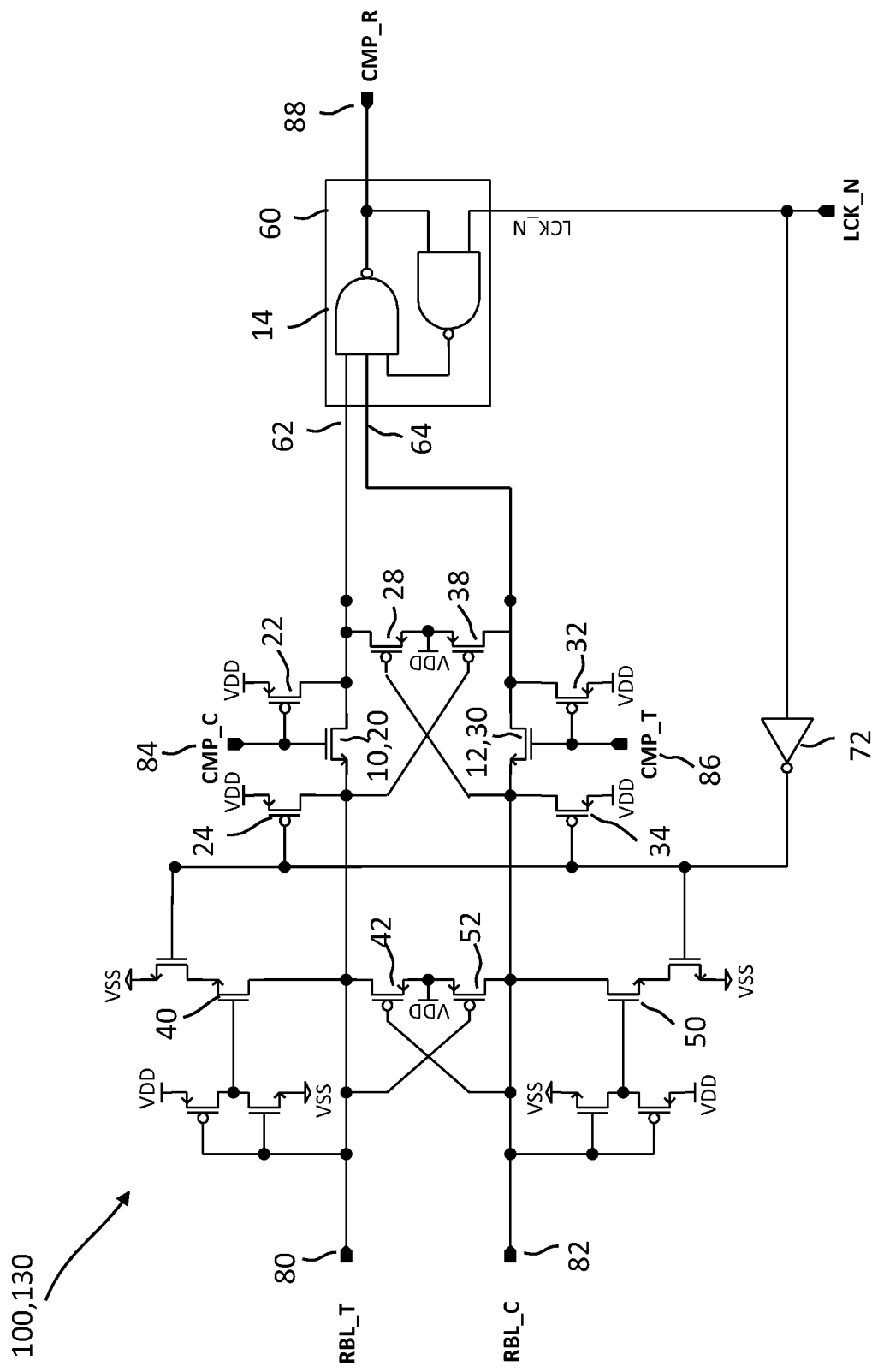
FIG. 3 depicts a true complement dynamic circuit for combining, in particular comparing, binary data representing an XNOR gate as a precharge to '1' logic circuit according to a further embodiment of the present invention.

FIG. 3 depicts a true complement dynamic circuit 100 for combining, in particular comparing, binary data representing an XNOR gate according to a further embodiment of the present invention.

The embodiment shown in FIG. 2 resembles the embodiment shown in FIG. 1, except that the precharging PFET devices 26, 36 are omitted. This may be possible under certain circumstances because the device 26, 36 are provided for noise immunity of the circuit 100. So for certain uses of the circuit 100 these devices 26, 36 may not be needed.

The same conditions are valid for other respective combinations of devices like keeper devices 42, 52 or keeper devices 28, 38 or keeper devices 22, 32 as well as keeper devices 40, 50 and for the respective combinations.

Figure 4:
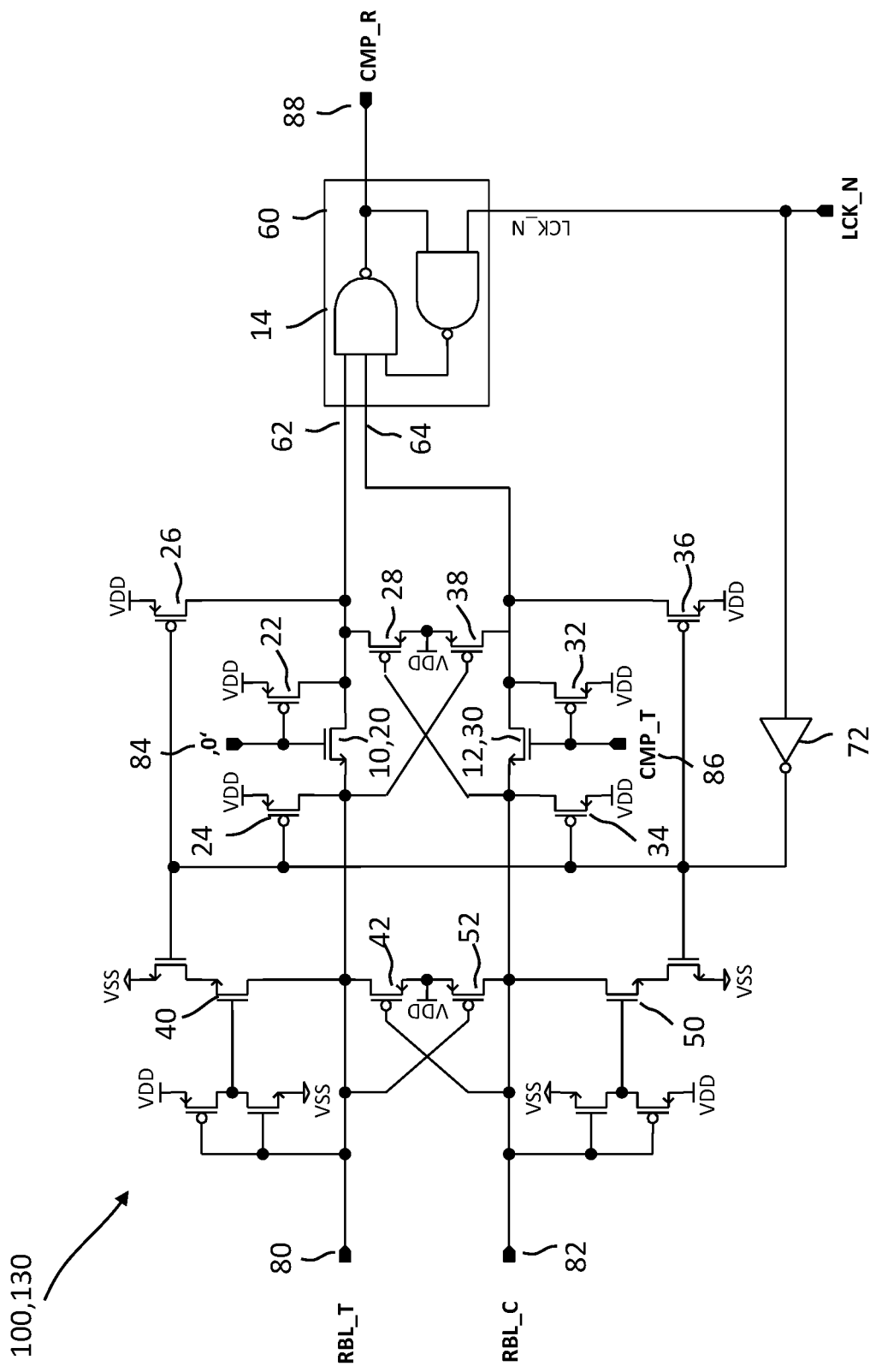
FIG. 4 depicts a true complement dynamic circuit for combining, in particular comparing, binary data representing an 'A AND B' gate according to a further embodiment of the present invention.
Figure 5:
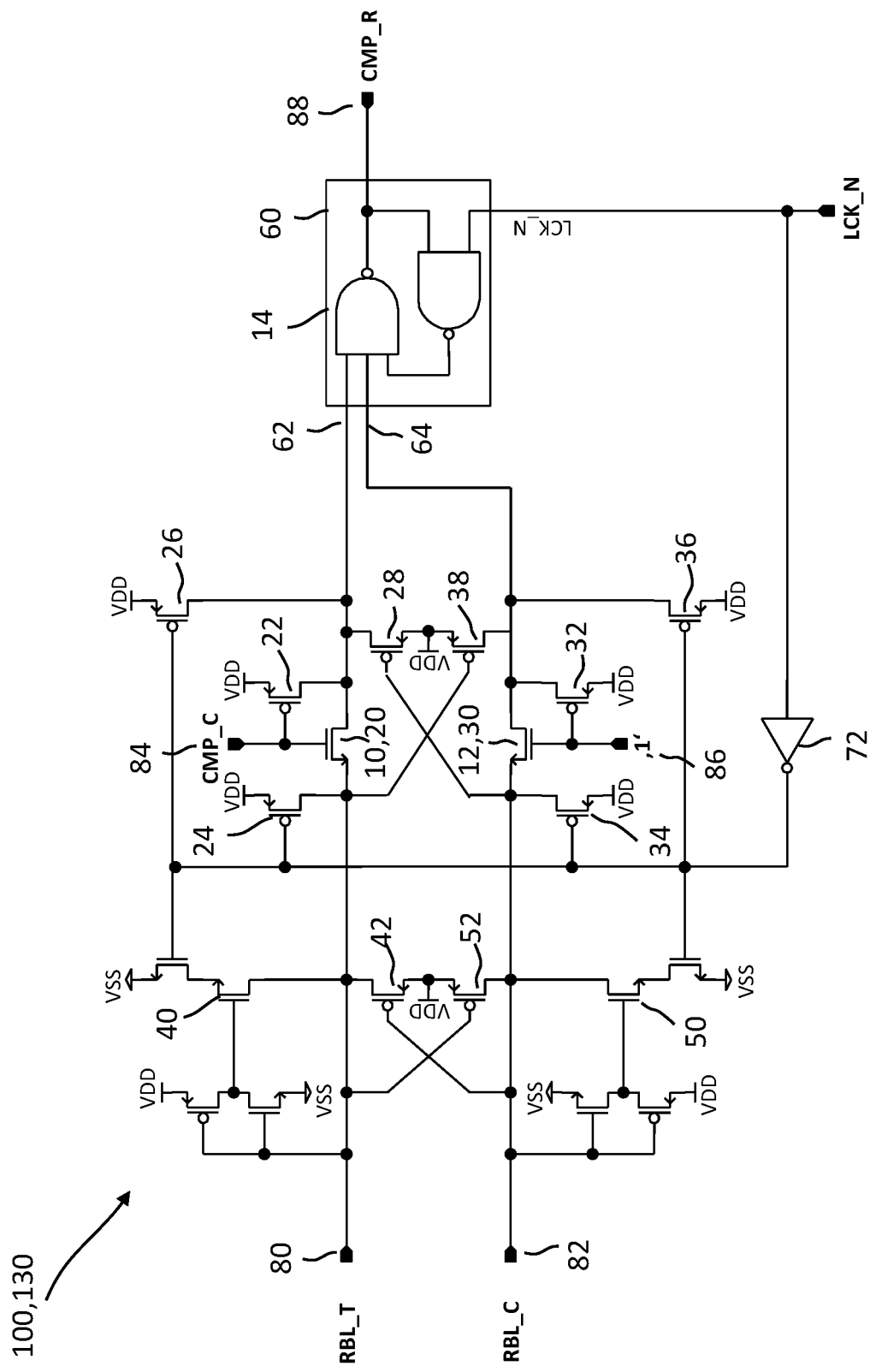
FIG. 5 depicts a true complement dynamic circuit for combining, in particular comparing, binary data representing an 'A OR NOT B' gate according to a further embodiment of the present invention.

FIG. 4 depicts a true complement dynamic circuit 100 for combining, in particular comparing, binary data representing an 'A AND B' gate according to a further embodiment of the present invention, whereas FIG. 5 depicts a true complement dynamic circuit 100 for combining, in particular comparing, binary data representing an 'A OR NOT B' gate according to a further embodiment of the present invention.

The circuits 100 shown in FIGS. 1 and 3 resemble an XNOR gate if the first and second input signals 80, 82 (RBL_T/RBL_C) and the third and fourth input signals 84, 86 (CMP_T/CMP_C) each represent complementary inputs. Then the pass gate devices 20, 30 with the third and the fourth signal 84, 86 (CMP_T/CMP_C) are logically equivalent to an OR gate. The combination with the NAND gate of the logical component 60, wherein cross coupled feedback allows for stable static output, represents the logic exclusive NOR function which is a typical 1-bit compare circuit 130.

However if the requirement that the third and the fourth signal 84, 86 (CMP_T/CMP_C) are complementary inputs is dropped and either one of the third and the fourth signal 84, 86 (CMP_T/CMP_C) is tied to '0' or '1' other logic functions than XNOR can be achieved.

If the third signal 84 (CMP_C) is tied to '0' the logical function 'A AND B' may result as an output CMP_R of the logical component 60, which is depicted in FIG. 4.

If the fourth signal 86 (CMP_T) is tied to '1' the logical function 'A OR NOT B' may result as an output CMP_R of the logical component 60, which is depicted in FIG. 5.

Figure 6:
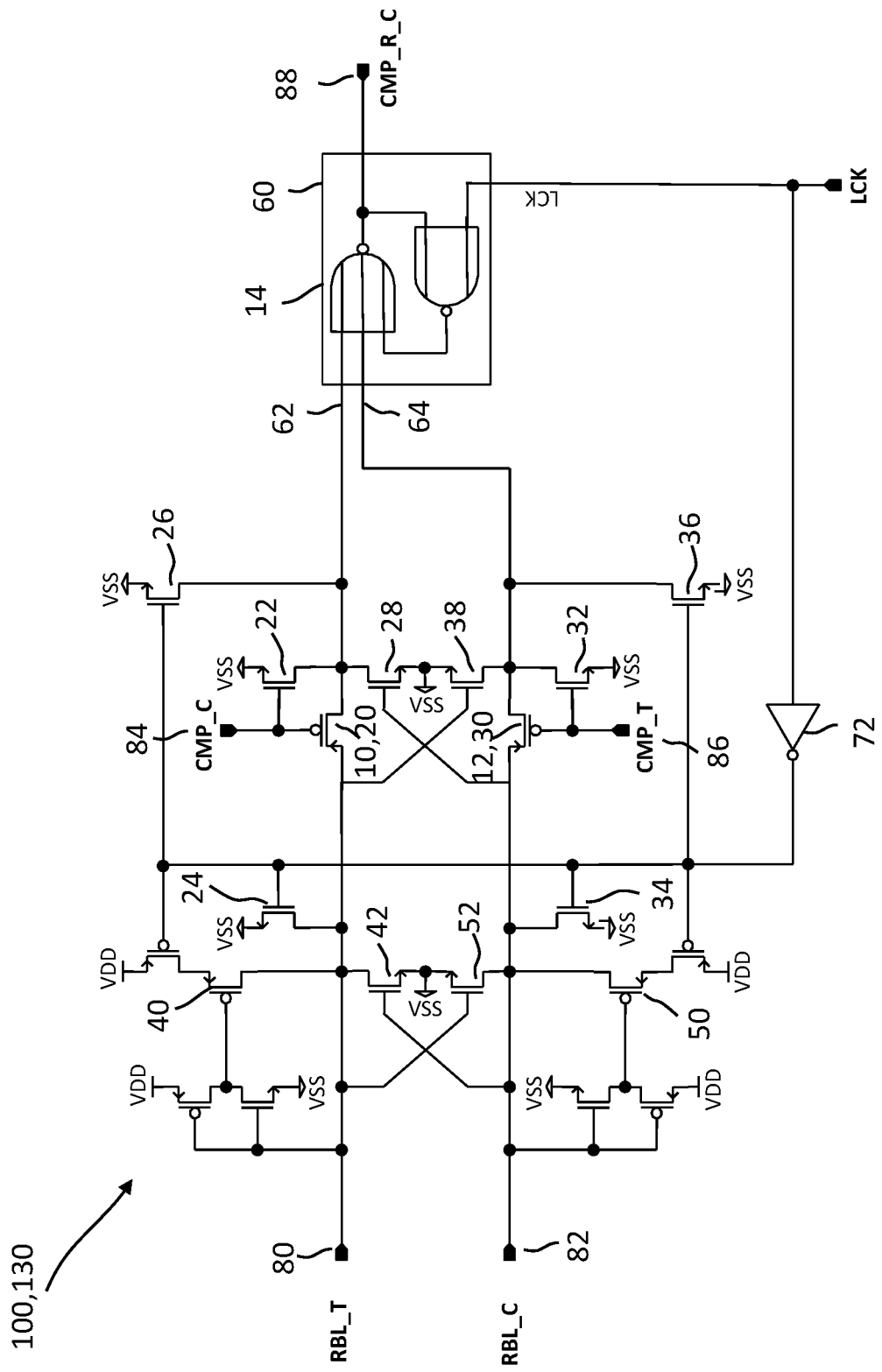
FIG. 6 depicts a true complement dynamic circuit for combining, in particular comparing, binary data on dynamic first and second input signals to third and fourth input signals representing an XOR gate as a precharge to '0' logic circuit according to a further embodiment of the present invention.

FIG. 6 depicts a true complement dynamic circuit 100 for combining, in particular comparing, binary data on dynamic first and second input signals 80, 82 to third and fourth input signals 84, 86 representing an XOR gate as a precharge to '0' logic circuit according to a further embodiment of the present invention.

The structure of the circuit 100 is the same as the one shown in FIG. 1. Only PFET devices are exchanged to NFET devices and vice versa.

The logical behavior represents an XOR gate in the case of the precharge to '0' logic circuit, if the third and fourth input signals 84, 86 are complementary signals during an evaluation phase, wherein the third input signal 84 is received from a complement compare data line CMP_C and the fourth input signal 86 is received from a true compare data line CMP_T.

The circuit 100 comprises the third part 14 for logically combining the fifth signal 62 and the sixth signal 64 to a seventh signal 88 as an output CMP_R_C with a logical NOR operation to a seventh signal 88 as an output CMP_R_C.

The third part 14 comprises the logical component 60, wherein the fifth signal 62 is received on a first input of the logical component 60; and wherein the sixth signal 64 is received on a second input of the logical component 60. The logical component 60 is implemented as a cross-coupled two-way NOR gate, representing a prefetch latch converting dynamic input signals 80, 82 back to a static output signal 88.

The circuit 100 is controlled by a positive active clock signal LCK, which is directly received as an input by the third part 14 and which is received as an input by the first part 10 and the second part 12 via an inverter 72.

NFET devices 24, 34 are used for precharging the first input signal 80 and the second input signal 82 to '0'.

Cross-coupled transistors 42, 52, in particular cross-coupled NFET transistors 42, 52 are implemented for preserving precharge levels for the signals 80, 82 that should remain at '0' during the evaluation phase The circuit 100 comprises P-keeper devices 40, 50 gated by the inverted positive active clock signal LCK.

NFET devices 26, 36 are used for precharging the fifth signal 62 and the sixth signal 64.

Figure 7:
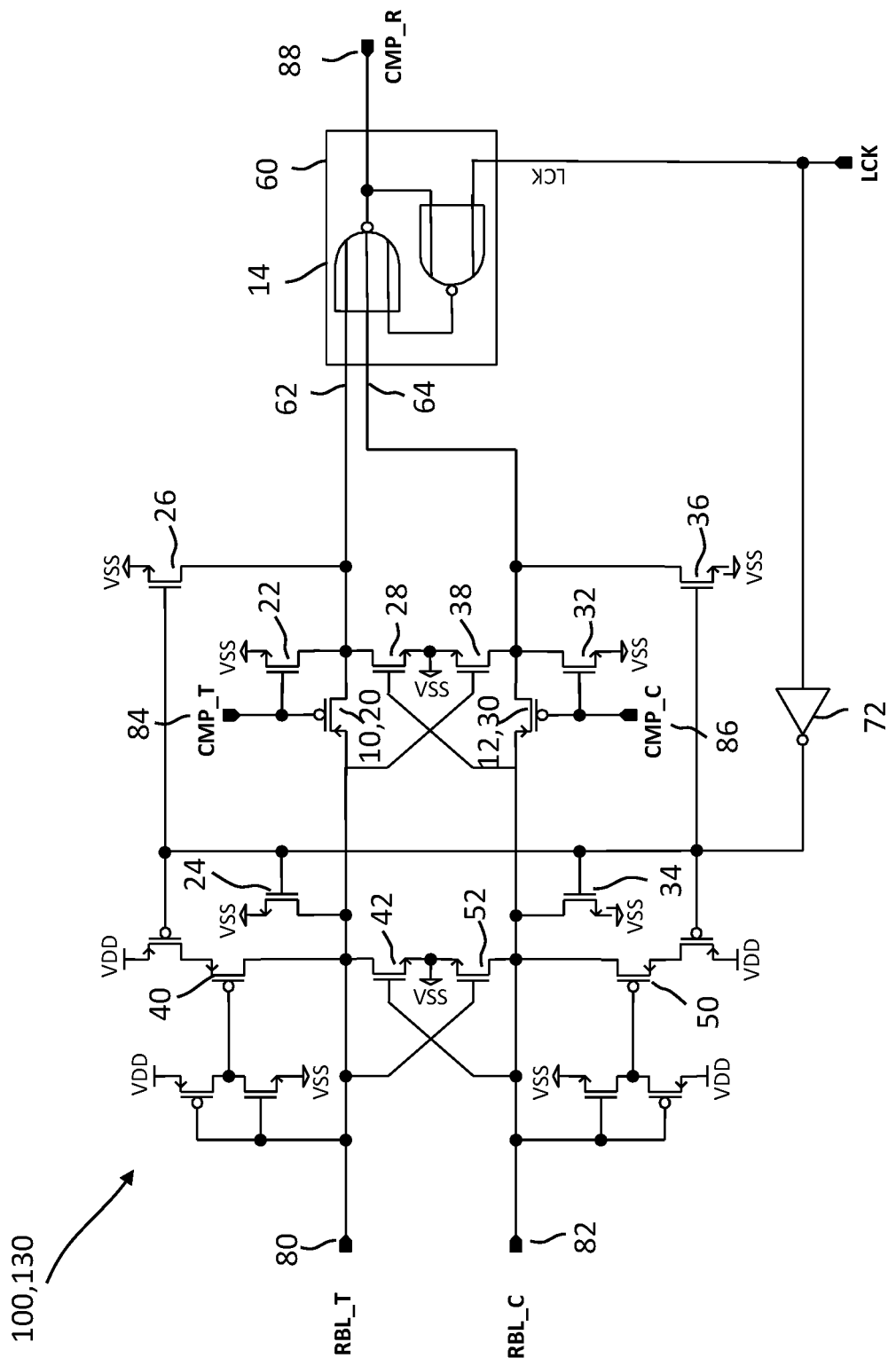
FIG. 7 depicts a true complement dynamic circuit for combining, in particular comparing, binary data on dynamic first and second input signals to third and fourth input signals representing an XNOR gate as a precharge to '0' logic circuit according to a further embodiment of the present invention.

If the third and fourth signals 84, 86 of the embodiment depicted in FIG. 6 are swapped in a way that the third signal 84 is a true compare data line signal CMP_T and the fourth signal 86 is a complement compare data line signal CMP_C, the circuit 100 acts as a cross coupled XNOR device. This embodiment is shown in FIG. 7. The seventh signal 88 results in an output CMP_R.

According to the proposed method for operating a true complement dynamic circuit 100 for combining, in particular comparing, binary data on dynamic first and second input signals 80, 82 to third and fourth input signals 84, 86, at least a 1-bit compare circuit 130 is operated, wherein the dynamic first and second input signals 80, 82 are complementary signals during an evaluation phase, wherein a logical behavior is determined by the third and fourth input signals 84, 86. The third and fourth input signals 84, 86 hereby are dynamic or static signals.

The first and second input signals 80, 82 may be received from a true read bit line RBL_T and a complement read bit line RBL_C, respectively, wherein both signals 80, 82 are dynamic input signals.

Further the logical behavior may represent an XNOR gate in the case of a precharge to '1' logic circuit and an XOR gate in the case of a precharge to '0' logic circuit, respectively, if the third and fourth input signals 84, 86 are complementary signals during an evaluation phase, by receiving the third input signal 84 from a complement compare data line CMP_C and receiving the fourth input signal 86 from a true compare data line CMP_T.

Due to a further embodiment the logical behavior may represent an 'A AND B' gate, by tying the third input signal 84 to a value of '0' and receiving the fourth input signal 86 from a true compare data line CMP_T.

Due to a further embodiment the logical behavior may represent an 'A OR NOT B' gate, by receiving the third input signal 84 from a complement compare data line CMP_C and tying the fourth input signal 86 to a value of '1'.

According to the proposed method, the first input signal 80 and the third input signal 84 may be logically combined with a logical 'A OR NOT B' operation creating a fifth signal 62 and the second input signal 82 and the fourth 86 input signal logically combined with a logical 'A OR NOT B' operation creating a sixth signal 64. Further the fifth signal 62 and the sixth signal 64 may be logically combined to a seventh signal 88 as an output CMP_R; CMP_R_C, with a logical NAND operation in the case of a precharge to '1' logic circuit to a seventh signal 88 as an output CMP_R, or with a logical NOR operation in the case of a precharge to '0' logic circuit to a seventh signal 88 as an output CMP_R_C.

Further exemplary embodiments of the present disclosure are set out in the following numbered clauses:

Numbered clause 1: A true complement dynamic circuit (100) for combining, in particular comparing, binary data on dynamic first and second input signals (80, 82) to third and fourth input signals (84, 86), comprising at least a 1-bit compare circuit (130), wherein the dynamic first and second input signals (80, 82) are complementary signals during an evaluation phase, wherein a logical behavior is determined by the third and fourth input signals (84, 86).

Numbered clause 2: The circuit according to clause 1, wherein the first and second input signals (80, 82) are received from a true read bit line (RBL_T) and a complement read bit line (RBL_C), respectively, wherein both signals (80, 82) are dynamic input signals.

Numbered clause 3: The circuit according to clause 1 or 2, wherein the logical behavior represents an XNOR gate in the case of a precharge to '1' logic circuit and an XOR gate in the case of a precharge to '0' logic circuit, respectively, if the third and fourth input signals (84, 86) are complementary signals during an evaluation phase, wherein the third input signal (84) is received from a complement compare data line (CMP_C) and the fourth input signal (86) is received from a true compare data line (CMP_T).

Numbered clause 4: The circuit according to clause 1 or 2, wherein the logical behavior represents an XOR gate in the case of a precharge to '1' logic circuit and an XNOR gate in the case of a precharge to '0' logic circuit, respectively, if the third and fourth input signals (84, 86) are complementary signals during an evaluation phase, wherein the third input signal (84) is received from a true compare data line (CMP_T) and the fourth input signal (86) is received from a complement compare data line (CMP_C).

Numbered clause 5: The circuit according to any one of clauses 1 or 2, wherein the logical behavior represents an 'A AND B' gate, wherein the third input signal (84) is tied to a value of '0' and the fourth input signal (86) is received from a true compare data line (CMP_T).

Numbered clause 6: The circuit according to any one of clauses 1 or 2, wherein the logical behavior represents an 'A OR NOT B' gate, wherein the third input signal (84) is received from a complement compare data line (CMP_C) and the fourth input signal (86) is tied to a value of '1'.

Numbered clause 7: The circuit according to any one of clauses 1 to 6,
wherein the 1-bit compare circuit (130) comprises at least (i) a first part (10) which is logically combining the first input signal (80) and the third input signal (84) with a logical 'A OR NOT B' operation creating a fifth signal (62);
(ii) a second part (12) which is logically combining the second input signal (82) and the fourth (86) input signal with a logical 'A OR NOT B' operation creating a sixth signal (64);
(iii) a third part (14) for logically combining the fifth signal (62) and the sixth signal (64) to a seventh signal (88) as an output (CMP_R; CMP_R_C),
with a logical NAND operation in the case of a precharge to '1' logic circuit to a seventh signal (88) as an output (CMP_R),
or
with a logical NOR operation in the case of a precharge to '0' logic circuit to a seventh signal (88) as an output (CMP_R_C).

Numbered clause 8: The circuit according to clause 7, wherein the first part (10) comprises at least a first pass gate transistor (20),
wherein the first input signal (80) is received on a source of the first pass gate transistor (20);
wherein the third input signal (84) is received on a gate of the first pass gate transistor (20), wherein the second part (12) comprises at least a second pass gate transistor (30),
wherein the second input signal (82) is received on a source of the second pass gate transistor (30);
wherein the fourth input signal (86) is received on a gate of the second pass gate transistor (30).

Numbered clause 9: The circuit according to any one of clauses 7 to 8, wherein the third part (14) comprises at least a logical component (60),
wherein the fifth signal (62) is received on a first input of the logical component (60);
wherein the sixth signal (64) is received on a second input of the logical component (60), wherein the logical component (60) is implemented
as a cross-coupled two-way NAND gate in the case of a precharge to '1' logic circuit; or
as a cross-coupled two-way NOR gate in the case of a precharge to '0' logic circuit, respectively,
representing a prefetch latch converting dynamic input signals (80, 82) back to a static output signal (88).

Numbered clause 10: The circuit according to any one of clauses 7 to 9, wherein the seventh signal (88) is a comparison result of the first input signal (80) and the second input signal (82) versus the third input signal (84) and the fourth input signal (86), respectively, as an output (CMP_R; CMP_R_C).

Numbered clause 11: The circuit according to any one of clauses 1 to 10, wherein at least the first input signal (80) and the second input signal (82) are dynamic signals, in particular restored to '1' signals or restored to '0' signals, respectively, during a precharge phase and complementary signals during an evaluation phase,
wherein the third input signal (84) and the fourth input signal (86) are static signals or dynamic signals.

Numbered clause 12: The circuit according to any one of clauses 1 to 11, wherein for compare operations the third input signal (84) and the fourth input signal (86) are complementary signals.

Numbered clause 13: The circuit according to any one of clauses 7 to 12, being controlled by a negative active clock signal (LCK_N) in the case of a precharge to '1' logic circuit and by a positive active clock signal (LCK) in the case of a precharge to '0' logic circuit, respectively, which is directly received as an input by the third part (14) and which is received as an input by the first part (10) and the second part (12) via an inverter (72).

Numbered clause 14: The circuit according to any one of clauses 1 to 13, wherein PFET devices (24, 34) in the case of a precharge to '1' logic circuit and NFET devices (24, 34) in the case of a precharge to '0' logic circuit, respectively, are used for precharging the first input signal (80) and the second input signal (84) to '1' or to '0', respectively.

Numbered clause 15: The circuit according to any one of clauses 1 to 14, wherein cross-coupled transistors (42, 52), in particular cross-coupled PFET transistors (42, 52) in the case of a precharge to '1' logic circuit and cross-coupled NFET transistors (42, 52) in the case of a precharge to '0' logic circuit, respectively, are implemented for preserving precharge levels for the signals (80, 82) that should remain at '1' or at '0', respectively, during the evaluation phase.

Numbered clause 16: The circuit according to any one of clauses 1 to 15, comprising N-keeper devices (40, 50) gated by the inverted negative active clock signal (LCK_N) in the case of a precharge to '1' logic circuit and P-keeper devices (40, 50) gated by the inverted positive active clock signal (LCK) in the case of a precharge to '0' logic circuit, respectively.

Numbered clause 17: The circuit according to any one of clauses 7 to 16, wherein the third input signal (84) is connected to the gate of a keeper device (22) as a keeper for the fifth signal (62) and the fourth input signal (86) is connected to the gate of a keeper device (32) as a keeper for the sixth signal (64).

Numbered clause 18: The circuit according to any one of clauses 7 to 17, wherein PFET devices (26, 36) in the case of a precharge to '1' logic circuit and NFET devices (26, 36) in the case of a precharge to '0' logic circuit, respectively, are used for precharging the fifth signal (62) and the sixth signal (64), respectively.

Numbered clause 19: A method for operating a true complement dynamic circuit (100) according to at least clause 1, for combining, in particular comparing, binary data on dynamic first and second input signals (80, 82) to third and fourth input signals (84, 86), comprising operating at least a 1-bit compare circuit (130), wherein the dynamic first and second input signals (80, 82) are complementary signals during an evaluation phase, determining a logical behavior by the third and fourth input signals (84, 86).

Numbered clause 20: The method according to clause 19, wherein receiving the first and second input signals (80, 82) from a true read bit line (RBL_T) and a complement read bit line (RBL_C), respectively, wherein both signals (80, 82) are dynamic input signals.

Numbered clause 21: The method according to clause 19 or 20, further the logical behavior representing an XNOR gate in the case of a precharge to '1' logic circuit and an XOR gate in the case of a precharge to '0' logic circuit, respectively, if the third and fourth input signals (84, 86) are complementary signals during an evaluation phase, by receiving the third input signal (84) from a complement compare data line (CMP_C) and receiving the fourth input signal (86) from a true compare data line (CMP_T).

Numbered clause 22: The method according to clause 19 or 20, further the logical behavior representing an XOR gate in the case of a precharge to '1' logic circuit and an XNOR gate in the case of a precharge to '0' logic circuit, respectively, if the third and fourth input signals (84, 86) are complementary signals during an evaluation phase, by receiving the third input signal (84) from a true compare data line (CMP_T) and receiving the fourth input signal (86) from a complement compare data line (CMP_C).

Numbered clause 23: The method according to clause 19 or 20, further the logical behavior representing an 'A AND B' gate, by tying the third input signal (84) to a value of '0' and receiving the fourth input signal (86) from a true compare data line (CMP_T).

Numbered clause 24: The method according to clause 19 or 20, further the logical behavior representing an 'A OR NOT B' gate, by receiving the third input signal (84) from a complement compare data line (CMP_C) and tying the fourth input signal (86) to a value of '1'.

Numbered clause 25: The method according to any one of clauses 19 to 24, at least comprising (i) logically combining the first input signal (80) and the third input signal (84) with a logical 'A OR NOT B' operation creating a fifth signal (62);
(ii) logically combining the second input signal (82) and the fourth (86) input signal with a logical 'A OR NOT B' operation creating a sixth signal (64);
(iii) logically combining the fifth signal (62) and the sixth signal (64) to a seventh signal (88) as an output (CMP_R; CMP_R_C),
  with a logical NAND operation in the case of a precharge to '1' logic circuit to a seventh signal (88) as an output (CMP_R),
or
  with a logical NOR operation in the case of a precharge to '0' logic circuit to a seventh signal (88) as an output (CMP_R_C).

REFERENCE NUMERALS 10 first part
12 second part
14 third part
20 pass gate transistor
22 keeper device
24 precharging device
26 precharging device
28 keeper device
30 pass gate transistor
32 keeper device
34 precharging device
36 precharging device
38 keeper device
40 keeper device
42 keeper device
50 keeper device
52 keeper device
60 logical component
62 fifth signal
64 sixth signal
72 inverter
80 first input signal
82 second input signal
84 third input signal
86 fourth input signal
88 seventh signal, output signal
100 true complement dynamic circuit
130 1-bit compare circuit
CMP_T true compare data line
CMP_C complement compare data line
RBL_T true read bit line
RBL_C complement read bit line
CMP_R output
CMP_R_C output
LCK_N negative active logical clock
LCK positive active logical clock
VDD power supply voltage
VSS ground level voltage

What is claimed is:

1. A true complement dynamic circuit for combining, in particular comparing, binary data on dynamic first and second input signals to third and fourth input signals, comprising:
  at least a 1-bit compare circuit, wherein a first input signal and a second input signal are dynamic signals, the dynamic first and second input signals are complementary signals during an evaluation phase, at least the first input signal and the second input signal are restored to '1' signals or restored to '0' signals, respectively, during a precharge phase, and the dynamic first and second input signals are complementary signals during an evaluation phase;

wherein a logical behavior is determined by a third input signal and a fourth input signal, the third and fourth input signals being static signals or dynamic signals.

2. The circuit of claim 1, wherein:
the first and second input signals are received from a true read bit line (RBL_T) and a complement read bit line (RBL_C), respectively, the first and second input signals being dynamic input signals.

3. The circuit of claim 1, wherein:
the third input signal is received from a complement compare data line (CMP_C);
the fourth input signal is received from a true compare data line (CMP_T); and
if the third and fourth input signals are complementary signals during an evaluation phase:
the logical behavior represents an XNOR gate in the case of a precharge to '1' logic circuit and an XOR gate in the case of a precharge to '0' logic circuit, respectively.

4. The circuit of claim 1, wherein:
the third input signal is received from a true compare data line (CMP_T);
the fourth input signal is received from a complement compare data line (CMP_C); and
if the third and fourth input signals are complementary signals during an evaluation phase:
the logical behavior represents an XOR gate in the case of a precharge to '1' logic circuit and an XNOR gate in the case of a precharge to '0' logic circuit, respectively.

5. The circuit of claim 1, wherein:
the third input signal is tied to a value of "0;"
the fourth input signal is received from a true compare data line (CMP_T); and
the logical behavior represents an 'A AND B' gate.

6. The circuit of claim 1, wherein:
the third input signal is received from a complement compare data line (CMP_C);
the fourth input signal is tied to a value of "1;" and
the logical behavior represents an 'A OR NOT B' gate.

7. The circuit of claim 1, wherein the 1-bit compare circuit comprises at least:
a first part, which is logically combining the first input signal and the third input signal with a logical "A OR NOT B" operation creating a fifth signal;
a second part which is logically combining the second input signal and the fourth input signal with a logical "A OR NOT B" operation creating a sixth signal; and
a third part for logically combining the fifth signal and the sixth signal to a seventh signal as an output (CMP_R; CMP_R_C), with a logical NAND operation in the case of a precharge to "1" logic circuit to a seventh signal as an output (CMP_R), or with a logical NOR operation in the case of a precharge to "0" logic circuit to a seventh signal as an output (CMP_R_C).

8. The circuit of claim 7, wherein:
the first part comprises at least a first pass gate transistor, the first input signal is received on a source of the first pass gate transistor, and the third input signal is received on a gate of the first pass gate transistor; and
the second part comprises at least a second pass gate transistor, the second input signal is received on a source of the second pass gate transistor; and the fourth input signal is received on a gate of the second pass gate transistor.

9. The circuit of claim 7, wherein:
the third part comprises at least a logical component, the fifth signal is received on a first input of the logical component, and the sixth signal is received on a second input of the logical component; and
the logical component is implemented:
as a cross-coupled two-way NAND gate in the case of a precharge to '1' logic circuit; or
as a cross-coupled two-way NOR gate in the case of a precharge to '0' logic circuit, respectively, representing a prefetch latch converting dynamic input signals back to a static output signal.

10. The circuit of claim 7, wherein the seventh signal is a comparison result of the first input signal and the second input signal versus the third input signal and the fourth input signal, respectively, as an output (CMP_R; CMP_R_C).

11. The circuit of claim 7, being controlled by a negative active clock signal (LCK_N) in the case of a precharge to '1' logic circuit and by a positive active clock signal (LCK) in the case of a precharge to '0' logic circuit, respectively, which is directly received as an input by the third part and which is received as an input by the first part and the second part via an inverter.

12. The circuit of claim 7, wherein the third input signal is connected to the gate of a keeper device as a keeper for the fifth signal and the fourth input signal is connected to the gate of a keeper device as a keeper for the sixth signal.

13. The circuit of claim 7, wherein PFET devices in the case of a precharge to '1' logic circuit and NFET devices in the case of a precharge to '0' logic circuit, respectively, are used for precharging the fifth signal and the sixth signal, respectively.

14. The circuit of claim 1, wherein for compare operations the third input signal and the fourth input signal are complementary signals.

15. The circuit of claim 1, wherein PFET devices in the case of a precharge to '1' logic circuit and NFET devices in the case of a precharge to '0' logic circuit, respectively, are used for precharging the first input signal and the second input signal to '1' or to '0', respectively.

16. The circuit of claim 1, wherein cross-coupled transistors, in particular cross-coupled PFET transistors in the case of a precharge to '1' logic circuit and cross-coupled NFET transistors in the case of a precharge to '0' logic circuit, respectively, are implemented for preserving precharge levels for the signals that should remain at '1' or at '0', respectively, during the evaluation phase.

17. The circuit of claim 1, comprising N-keeper devices gated by the inverted negative active clock signal (LCK_N) in the case of a precharge to '1' logic circuit and P-keeper devices gated by the inverted positive active clock signal (LCK) in the case of a precharge to '0' logic circuit, respectively.

18. A method for operating a true complement dynamic circuit comprising:
comparing binary data on dynamic first and second input signals to a third input signal and a fourth input signal, by:
operating at least a 1-bit compare circuit, wherein the dynamic first and second input signals being complementary signals during an evaluation phase,
receiving the third input signal from a true compare data line (CMP_T);
receiving the fourth input signal from a complement compare data line (CMP_C);
determining a logical behavior by the third and fourth input signals, the logical behavior representing:

an XOR gate in the case of a precharge to '1' logic circuit; and an XNOR gate in the case of a precharge to "0" logic circuit, respectively;

wherein:

the third and fourth input signals are complementary signals during the evaluation phase.

19. The method of claim 18, further comprising:

receiving the first and the second input signals from a true read bit line (RBL_T) and a complement read bit line (RBL_C), respectively, the first and second input signals being dynamic input signals.

20. The method of claim 18, further comprising:

receiving the third input signal from a complement compare data line (CMP_C); and receiving the fourth input signal from a true compare data line (CMP_T);

wherein:

if the third and fourth input signals are complementary signals during an evaluation phase:

the logical behavior representing an XNOR gate in the case of a precharge to '1' logic circuit and an XOR gate in the case of a precharge to '0' logic circuit, respectively.

21. The method of claim 18, wherein the logical behavior represents an "A AND B" gate by:

tying the third input signal to a value of "0;" and receiving the fourth input signal from a true compare data line (CMP_T).

22. The method of claim 18, wherein the logical behavior represents an "A OR NOT B" gate by:

receiving the third input signal from a complement compare data line (CMP_C); and tying the fourth input signal to a value of "1."

23. The method of claim 18, further comprising logically combining the first input signal and the third input signal with a logical "A OR NOT B" operation, creating a fifth signal;

logically combining the second input signal and the fourth input signal with a logical "A OR NOT B" operation, creating a sixth signal;

logically combining the fifth signal and the sixth signal to a seventh signal as an output (CMP_R; CMP_R_C) with:

a logical NAND operation in the case of a precharge to "1" logic circuit to a seventh signal as an output (CMP_R), or a logical NOR operation in the case of a precharge to '0' logic circuit to a seventh signal as an output (CMP_R_C).

24. A true complement dynamic circuit for combining, in particular comparing, binary data on dynamic first and second input signals to third and fourth input signals, comprising:

at least a 1-bit compare circuit, wherein a first input signal and a second input signal are dynamic signals, the dynamic first and second input signals are complementary signals during an evaluation phase, the 1-bit compare circuit comprising at least:

a first part, which logically combines the first input signal and a third input signal with a logical "A OR NOT B" operation creating a fifth signal;

a second part, which logically combines the second input signal and a fourth input signal with a logical "A OR NOT B" operation creating a sixth signal; and a third part, which logically combines the fifth signal and the sixth signal creating a seventh signal as an output (CMP_R; CMP_R_C), with:

a logical NAND operation in the case of a precharge to "1" logic circuit to a seventh signal as an output (CMP_R), or a logical NOR operation in the case of a precharge to "0" logic circuit to a seventh signal as an output (CMP_R_C);

wherein a logical behavior is determined by the third input signal and the fourth input signal.

\* \* \* \* \*